United States Patent [19]

Hsu

[11] Patent Number: 5,023,231

[45] Date of Patent: Jun. 11, 1991

[54] METHOD FOR PREPARING A SUPERCONDUCTIVE FIBER OF FILM

[75] Inventor: Che-Hsiung Hsu, Wilmington, Del.

[73] Assignee: E. I. Du Pont de Nemours and Company, Wilmington, Del.

[21] Appl. No.: 310,384

[22] Filed: Feb. 15, 1989

Related U.S. Application Data

[63] Continuation-in-part of Ser. No. 188,341, May 4, 1988.

[51] Int. Cl.$^5$ ............................................. H01L 39/12
[52] U.S. Cl. ....................................... 505/1; 505/740; 505/780; 264/63; 264/211.11
[58] Field of Search ............. 264/56, 63, 211, 211.11, 264/211.12; 505/734, 704, 735, 736, 740, 780, 1; 501/95

[56] References Cited

FOREIGN PATENT DOCUMENTS 183317 11/1987 Japan.
300538 12/1988 Japan.

OTHER PUBLICATIONS

Goto et al., Japanese Journal of Applied Physics, vol. 26, No. 9, Sep. 1987, pp. 1527–1528.
Gota et al., Japanese Journal of Applied Physics, vol. 26, No. 2, Dec. 1987, pp. 1970–1972.
Ishii et al., Japanese Journal of Applied Physics, vol. 26, No. 12, Dec. 1987, pp. 1959–1960.

*Primary Examiner*—Hubert C. Lorin
*Assistant Examiner*—Christopher A. Fiorilla

[57] ABSTRACT

A method for preparing a superconductive fiber or film of improved critical current density. The method involves spinning an aqueous solution optionally containing a mixture of metal salts corresponding to the superconductive $YBa_2Cu_3O_x$ and a water soluble polymer. This method produces a more dense superconductive material upon firing.

2 Claims, No Drawings

METHOD FOR PREPARING A SUPERCONDUCTIVE FIBER OF FILM

This application is a continuation-in-part of application Ser. No. 07/188,341, filed May 4, 1988.

BACKGROUND OF THE INVENTION

The use of a powder mixture for production of superconductive filaments is taught in the Japanese Journal of Applied Physics, V.26 N.9 Sept. 1987, pp. L1527-L1528, Goto et al. In this article is described a process that involves mixing $Y_2O_3$, $BaCO_3$ and $CuO$ powders, grinding and then heating them at 1223° K. for 5 hours. The product is ground and suspended in an aqueous solution of poly(vinyl alcohol) containing a dispersant. The suspension is then extruded as a filament into an alkaline aqueous solution, collected, neutralized, washed and dried. The filament was then heated to remove volatile components.

The production of an analogous product is described in a subsequent article by Goto et al. in the Japanese Journal of Applied Physics, V26, N.12, December 1987, pp. L 1970-L 1972. This time the powder which has been heated to 1223° K. is ground and suspended in an aqueous solution containing Y, Ba and Cu nitrates as well as polyvinyl alcohol and sodium dodecyl sulfate as a dispersant and then treated as before.

SUMMARY OF THE INVENTION

A method for preparing superconductive fiber of improved critical current density comprising forming a dispersion of a superconductive oxide precursor in an aqueous medium of a water soluble polymer, extruding the dispersion into fibers through an orifice, and drying and firing the fibers to convert it into shaped superconductive fiber, said superconductive oxide precursor comprising a homogeneous mixture of $BaCO_3$, $CuO$, and an amorphous yttrium compound, in which the elements Y, Ba and Cu are intimately mixed on a micron to sub-micron scale and are present in the mixture in the ratio of 1:2:3 and which is prepared by a process comprising the steps of:
  (a) blending an aqueous mixture of yttrium acetate, copper acetate, and a source of barium selected from barium hydroxide and barium acetate;
  (b) removing excess solvent from the mixture; and
  (c) calcining the product in air by heating while increasing the temperature from ambient to a temperature in the range of 450° C. to 750° C. and maintaining that temperature for at least one hour.

Preferably, the aqueous medium containing the water-soluble polymer, additionally contains salts of yttrium, barium and copper, said metals being in the atomic proportions of 1:2:3. Films prepared from the compositions are also contemplated.

DETAILED DESCRIPTION OF THE INVENTION

In accordance with this invention, a precursor for a superconductive oxide is combined with an aqueous solution of a water soluble polymer. The aqueous medium advantageously contains in addition to the water-soluble polymer, salts of yttrium, barium and copper, said metals being in the atomic proportions of 1:2:3, respectively. The material is then extruded into fiber, dried and fired to form superconductive material by techniques known in the art. Alternatively, the material may be shaped into films, then dried and fired as discussed above.

In the preparation of the spinning dispersion, it is desirable to first prepare the metal salt solution by dissolving the metal salts in water in the desired metal ratio. The soluble polymer and additional water are then combined with the salt solution and heated until a spinnable viscous solution is obtained. Finally, the particulate superconductive oxide precursor is added stepwise with rigorous stirring or mixing until a generally stable dispersion is obtained. Preferably the particulate oxide precursor should be reduced to a particle size as small as possible.

Examples of useful metal salts and proportions are disclosed in my copending, coassigned U.S. application Ser. No. 153,075. They are employed in the aqueous solution, preferably at a concentration in the range of 11 to 16% on a wt. basis. The metal salts are believed to assist in producing a more dense superconductive material.

Superconductive oxide precursors for the purposes of the present invention are described and prepared by techniques disclosed in copending and coassigned U.S. application Ser. No. 07/296,075, (CH 1533-A), filed Jan. 12, 1989, to Connolly et al. The superconductive oxide precursor employed herein is a homogeneous mixture of $BaCO_3$, $CuO$, and an amorphous yttrium compound, in which the elements Y, Ba and Cu are intimately mixed on a micron to sub-micron scale and are present in the mixture in the ratio of 1:2:3. The precursor is prepared by forming an aqueous mixture of yttrium acetate, copper acetate, and a source of barium selected from barium hydroxide and barium acetate in which the atomic ratio of Y:Ba:Cu is about 1:2:3, followed by removing excess solvent from the mixture; and calcining the product in air by heating while increasing the temperature according to a predetermined timed sequence from ambient to a temperature in the range of 450° C. to 750° C. and maintaining that temperature for at least one hour, all as disclosed in said Connolly et al. application. The superconductive oxide precursor is employed in the dispersion to be extruded or cast in an amount of from about 80 to 91% by weight of water-soluble polymer.

Apart from the water, the final component in the dispersion to be extruded or cast is a water-soluble polymer, which holds the particulate material in shape so that it may be ultimately fired to form the superconductive article. Poly(vinyl alcohol) is the preferred polymer but other water-soluble polymers such as poly(ethylene oxide) are suitable. These polymers are used in amounts sufficient to accomplish the temporary function of maintaining the shape of the article since they are burned off in the firing step of forming the superconductive article. Amounts of as little as 6 wt. % based on the water present has been found useful. Generally, from 6 to 15 wt. % is employed.

The compositions are extruded into fibers or films or if desired cast into films which are then dried. The dried fibers or films are then fired to form the superconductive products.

MEASUREMENTS

Critical Current Density ($J_c$)

The $J_c$ at a given temperature is defined as the threshold current which passed through a given cross-sectional area of a superconductor to transform the material from the superconductive state to a normal state. The measurement is done using a 4-probe method known in the art. An amalgam is used as electrode material to reduce contact resistance to <0.5 ohm. The two inner electrodes are 6 mm apart. While the fiber is immersed in liquid nitrogen, current is applied to the two outer electrodes. The voltage corresponding to the current applied through the two outer electrodes is measured between the two inner electrodes with an electrometer. As current is increased, at a certain point the sample is driven to the normal state. When the sample shows a voltage of 1 microvolt, the corresponding current is defined as threshold current. The threshold current normalized with the cross-section of the fiber sample is defined as $J_c$.

The following examples are illustrative of the present invention and are not to be construed as limiting:

EXAMPLE 1

A solution of cupric acetate monohydrate (16.4 g, Fluka >99% purity), barium acetate (14.0 g Aldrich ACS reagent grade), yttrium nitrate pentahydrate, (10.0 g Aldrich >99% purity),d-sorbitol (17.5 g) and water (97.0 g) was first prepared at 50° C. To 21.0 g of this solution, 7.5 g polyvinylalcohol ("Elvanol" HV, Du Pont) with average MW of 115,000 and a degree of polymerization of 1,900, and 30.0 g water were added. The mixture was poured into a loosely capped plastic bottle which was then placed in an oven set at 85° C. Within 3 hours the mixture became a viscous and spinnable solution. To the ~80° C. solution 30.0 g superconductive oxide precursor of the aforementioned Connolly et al. application prepared as described below, was added at several intervals. Between each addition, the mixture was stirred vigorously with a spatula while kept at ~80° C.

The precursor was prepared as follows:

(a) Copper acetate monohydrate (230.0 g) was dissolved in 1.6 liter of purified water at about 75° C. forming a cloudy blue-green solution. To this was added a clear solution of yttrium acetate hydrate —128.6 g dissolved in 0.6 liter of purified water at 75° C. A cloudy barium hydroxide solution (containing some white precipitate after its preparation from heating 242.2 g of barium hydroxide octohydrate in 0.8 liter of purified water at 75° C.) was added to the yttrium/copper mixture over a period of 5 minutes. The resulting brownish mixture was maintained at 75° C. for 1 hour after which the water was evaporated by "spray" drying using a Buchi 190 mini spray dryer with a 0.7 mm nozzle.

(b) The dry powder from (a) was calcined in air, i.e., in an oxygen-containing atmosphere, according to the following predetermined timed sequence to 500° C.—1 hour - 100° C. (time-set temperature), ½ hour - 230° C., 1 hour - 270° C., 15 min - 320° C., 1 hour - 400° C., 1 hour - 480° C., 15 min - 500° C. - then held for 1 hour at 500° C. The calcined material is an intimate and homogeneous blend of stable $BaCO_3$, $CuO$ and amorphous yttrium compounds.

(c) Four batches treated as in (a) and (b) were hammermilled together to form a large lot from which the precursor powder for this Example was taken.

A portion of the dispersion was placed in a 10 ml plastic syringe for extrusion through the nozzle. The extruded filaments were hung on a horizontal rod. The extrudate was left to dry in air before being placed in alumina crucibles for air-firing in a Fisher #495 Ashing Furnace at the following cycle: 1° C./minute from RT to 160° C., 3 hours at 160° C., 2° C./minute from 160° C. to 915° C., 1 hour at 915° C., cooled down in air at the natural cooling rate of the furnace. Filaments of the fired extrudate show a sharp onset transition at 90° K. in excluding magnetic flux, indicating superconductivity. Electrical resistivity of the filaments determined by a 4-probe technique is $2.7 \times 10^{-3}$ ohm-cm at room temperature (RT). A precipitous drop in electrical resistance occurs at 90° K. and reaches a point where resistance cannot be detected at 83° K. The superconductivity transition is extremely sharp, indicating that the filaments are highly crystalline and pure. The assessment is supported by X-ray powder diffraction data. The characteristic $2\theta$ peaks at 32.8° and 33.2° are extremely sharp, indicating the material is highly crystalline. No other crystalline species were detected. The filaments have a density of 4.8 g/cc, equivalent to 75% of the theoretical density.

EXAMPLE 2

To 31.0 g of the metal salt solution prepared in Example 1, 7.5 g "Elvanol" HV and 22.0 g water were added. The mixture was converted to a solution according to the procedure described in Example 1. To the solution was added 30.0 g of a superconductive oxide precursor prepared as in Example 1 above. A dispersion, extrudate and filaments were prepared in the same manner as described in Example 1. A powder prepared from the air-fired filaments shows the same sharp $2\theta$ peaks. No other crystalline species was detected. Electrical resistivity of the filaments is $1.2 \times 10^{-3}$ ohm-cm at RT. They undergo a precipitous drop in electrical resistance at 90° K. and reach a point where resistance cannot be detected at 83° K. The sharp superconductivity transition confirms that the materials are pure and highly crystalline.

EXAMPLE 3

The dispersion prepared as in Example 1 was cast on microscope slides for making thick films. A portion of the dried films were air-fired according to the cycle described in Example 1. The air-fired films show an onset transition of Meissner effect at 90° K. Density of the films is 5.4 g/cc., equivalent to 84% of the theoretical density.

EXAMPLE 4

A metal salt solution identical to the one described in Example 1 was prepared. To 33.9 g of the solution was added 12.0 g "Elvanol" HV and 48.1 g water. The mixture was converted to a viscous and spinnable solution according to the procedure described in Example 1. To the 80° C. solution, 48 g of super-conductive oxide precursor was added. The procedure described in Example 1 for preparation of a dispersion was followed. The dispersion was transferred to a twin-cell mixer as described in U.S. Pat. No. 3,767,756. The twin cells were kept at 80° C. in a water bath while the dispersion was pumped back and forth for 55 minutes to ensure thorough mixing of the dispersion between the cells. The water bath was then removed and one of the twin cells was connected to a 20-mil spinneret. A 20-mesh screen was used for filtration. Filaments were extruded and collected on sheets for drying. The dried filaments were air-fired as described in Example 1. Average size of the filaments was 0.3 mm in diameter. The filaments showed a sharp onset transition at 90° K. in excluding magnetic flux, indicating that they are superconductive.

Electrical resistivity of the filaments at RT was $1.0 \times 10^{-3}$ ohm-cm. They undergo a precipitous drop in resistance at 90° K. and reach a point where resistance cannot be detected at 80° K. Critical current density ($J_c$) of the filaments at 77° K. is 64 A/cm$^2$.

Scanning electric micrographs (SEM) of a fractured cross-section of the filaments show a non-grainy morphology whereas the polished surfaces show distinct randomly oriented needle-like crystals. X-ray diffraction patterns of a powder prepared from the filaments show the sharp $2\theta$ peaks as described in Example 1.

EXAMPLE 5

A solution of cupric acetate monohydrate (4.1 g), barium acetate (3.5 g), yttrium nitrate pentahydrate (2.5 g), d-sorbitol (4.4 g) and water (24.3 g) was first prepared at 50° C. To 31.0 g of the solution, 12.0 g "Elvanol" HV and 49.3 water were added. The mixture was converted to a solution according to the procedure described in Example 1. To the solution 108 g of superconductive oxide precursor particulate was added. This precursor and the dispersion thereof were prepared in a manner similar to that of Example 1. The procedures for mixing (mixing time is 75 minutes), extrusion and air-firing are described in Example 4. The filaments from the air-fired extrudate show an onset transition at 90° K. in excluding magnetic flux. The electrical resistivity of the filaments at RT is $1.7 \times 10^{-3}$ ohm-cm. They undergo a precipitous drop in resistance at 92° K. and reach a point where resistance cannot be detected at 84° K. The $J_c$ at 77° K. is 130 A/cm$^2$.

The filaments have the same morphology and X-ray diffraction pattern as those described in Example 4.

EXAMPLE 6

A mixture of 12.0 9 "Elvanol" HV and 69.3 g water was poured into a loosely capped plastic bottle. The bottle was then placed in an oven set at 85° C. Within 2 hours the mixture became a homogeneous solution To the solution 117 g of superconductive oxide precursor employed in Example 5 was added. The procedures for dispersion preparation, mixing, extrusion and air-firing described in Example 5 were followed. Average size of the filaments from the air-fired extrudates is ~0.3 mm in diameter. They show an onset transition at 90° K. in excluding magnetic flux. They undergo a precipitous drop in electrical resistance at 90° K. and reach a point where resistance cannot be detected at 82° K. Jc at 77° K. was 48 A/cm$^2$. The filaments have the same morphology and X-ray diffraction pattern as those of Examples 4 and 5.

EXAMPLE 7

A mixture of 1 g poly(ethylene oxide) having an MW of 5,000,000 from Aldrich and 25 g water was placed in a loosely capped bottle. After the polymer powder was thoroughly wetted, the bottle was placed in an oven set at 80° C. The tacky solution was cooled down to RT before 14 g of superconductive oxide precursor similar to that employed in Example 5 was added to it at several intervals. At each addition, the dispersion was vigorously stirred. The dispersion was drawn into fibers by a spatula, which were dried on sheets. The dried fibers were air-fired according to the following cycle: RT to 150° C. at 0.5° C./min., 150° C. for 30 minutes, 150° C. to 680° C. at 1° C./min., 680° C. to 800° C. at 2° C./min., 800° C. for 5 minutes, 800° C. to 915° C. at 3° C./min., 915° C. for 1 hr., and cooled down to RT at the oven's natural cooling rate. X-ray diffraction patterns show that powder prepared by grinding the filament is orthorhombic, the correct phase for superconductivity. The air-fired fibers show super-conductivity transition in electrical resistance at temperatures above 77° K. They show an onset transition at 90° K. in excluding magnetic flux.

EXAMPLE 8

A portion of the extruded fiber prepared in Example 6 was cut into small pieces (~8 cm long). These pieces were placed in alumina boats which were put in a quartz container for firing in a Fisher #497 furnace. The container was fed with oxygen during the entire firing cycle at a rate of 1.0 SCFH (standard cubic feet per hour). The firing cycle was as follows: room temperature (RT) to 160° C. at 1° C./min, 1 hour at 160° C., 2° C./min to 850° C., 30 minutes at 850° C., 2° C./min to 935° C., 1 hour at 935° C., cooled down to 600° C. at 5° C./min, 1 hour at 600° C., 5° C./min to 300° C., one minute at 300° C., 5° C./min to 35° C. The average diameter of the oxygen-fired pieces was ~0.3 mm. When tested, they showed a sharp Meissner transition. As a test sample was cooled down from RT to 20° K., it started to exclude magnetic flux at 95° K. and almost completely excluded flux at 85° K. Critical current density of the fired filaments ranged from 861 to 1080 amps/cm$^2$ at 77° K. The measurement was done with silver instead of amalgam electrodes.

I claim:

1. A method for preparing superconductive fiber or film of improved critical current density comprising forming a dispersion of a superconductive oxide precursor in an aqueous medium containing a water soluble polymer, extruding the dispersion into fiber or film through an orifice, and drying and firing the fiber or film to convert them into shaped superconductive fiber or film, said superconductive oxide precursor comprising a homogeneous mixture of BaCO$_3$, CuO, and an amorphous yttrium compound, in which the elements Y, Ba and Cu are intimately mixed on a micron to submicron scale and are present in the mixture in the ratio of 1:2:3 and which is prepared by a process comprising the steps of:

(a) blending an aqueous mixture of yttrium acetate, copper acetate, and a source of barium selected from barium hydroxide and barium acetate;
   (b) removing excess solvent from the mixture; and
   (c) calcining the product in air by heating while increasing the temperature according to a predetermined timed sequence from ambient to a temperature in the range of 450° C. to 750° C. and maintaining that temperature for at least one hour.

2. A method according to claim 1 wherein the aqueous medium additionally contains salts of yttrium, barium and copper, said metals being present in the atomic proportions of 1:2:3, respectively.

* * * * *